(12) United States Patent
Inskeep et al.

(10) Patent No.: US 10,567,079 B1
(45) Date of Patent: Feb. 18, 2020

(54) ROBUST VISUAL LIGHT COMMUNICATION FOR VEHICLE-TO-VEHICLE COMMUNICATION

(71) Applicant: Ford Global Technologies, LLC, Dearborn, MI (US)

(72) Inventors: Grant Inskeep, Royal Oak, MI (US); David Michael Herman, Oak Park, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/118,742

(22) Filed: Aug. 31, 2018

(51) Int. Cl.
| | |
|---|---|
| *H04B 10/11* | (2013.01) |
| *G08G 1/09* | (2006.01) |
| *H03M 13/09* | (2006.01) |
| *H04L 7/00* | (2006.01) |
| *H03M 13/15* | (2006.01) |
| *H04B 10/116* | (2013.01) |
| *G08G 1/0967* | (2006.01) |
| *H04L 29/08* | (2006.01) |
| *H04L 7/04* | (2006.01) |

(52) U.S. Cl.
CPC ..... *H04B 10/116* (2013.01); *G08G 1/096791* (2013.01); *H03M 13/093* (2013.01); *H04L 67/12* (2013.01); *H03M 13/15* (2013.01); *H04L 7/048* (2013.01)

(58) Field of Classification Search
None
See application file for complete search history.

(56) References Cited

U.S. PATENT DOCUMENTS

| | | | |
|---|---|---|---|
| 8,965,218 B2 | 2/2015 | Son et al. | |
| 9,172,464 B2 | 10/2015 | Liu et al. | |
| 9,252,879 B2 | 2/2016 | Muguruma | |
| 2013/0156420 A1* | 6/2013 | Amitai | H04B 10/07953 398/27 |
| 2016/0301470 A1 | 10/2016 | Zhi et al. | |
| 2017/0310743 A1* | 10/2017 | Aoyama | H04L 67/1006 |
| 2018/0035019 A1 | 2/2018 | Back et al. | |

(Continued)

FOREIGN PATENT DOCUMENTS

| | | |
|---|---|---|
| CN | 103795467 A | 5/2014 |
| CN | 103905119 A | 7/2014 |

(Continued)

OTHER PUBLICATIONS

Isamu Takai et al., *LED and CMOS Image Sensor Based Optical Wireless Communication System for Automotive Applications*, vol. 5, No. 5, 2013, 19 pages.

*Primary Examiner* — Justin R Knapp
(74) *Attorney, Agent, or Firm* — Frank Lollo; Eversheds Sutherland (US) LLP (57) ABSTRACT

Method and apparatus are disclosed for robust visual light communication for vehicle-to-vehicle communication. An example vehicle includes a visual light communication (VLC) transmitter, a VLC communication receiver, and a VLC module. The VLC module sends a first handshake message including characteristics of the VLC transmitter and the VLC receiver using a first level of error correction. The VLC module also adjusts transmission parameters based on a received second handshake message. Additionally, the VLC module transmits data using a second level of error correction.

16 Claims, 4 Drawing Sheets

(56) References Cited

U.S. PATENT DOCUMENTS

2019/0278457 A1\* 9/2019 Ha .................. G06F 3/04166
2019/0295458 A1\* 9/2019 Krass .................. G09G 3/32

FOREIGN PATENT DOCUMENTS

| CN | 105703839 B | 1/2018 |
|---|---|---|
| JP | 2005236667 A | 9/2005 |
| JP | 2007013786 A | 1/2007 |
| JP | 5658985 B2 | 1/2015 |

\* cited by examiner

ROBUST VISUAL LIGHT COMMUNICATION FOR VEHICLE-TO-VEHICLE COMMUNICATION

TECHNICAL FIELD

The present disclosure generally relates to vehicle communication systems and, more specifically, robust visual light communication for vehicle-to-vehicle communication.

BACKGROUND

Increasingly, vehicle are using vehicle-to-vehicle communication to exchange safety information and coordinate movement. Visual Light Communication (VLC) is a technique that vehicles can use to communicate. VLC transmitters use light emitting diodes (LEDs) to transmit data packets by modulating the LED. VLC receivers may use a CMOS sensor with a rolling shutter mechanism. This results in temporal aliasing where the column or row of pixels in the image captures artifacts in fast moving objects or fast change in lighting levels during the image capture. In such a manner, the VLC receivers decode the light from the LED into binary data.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are disclosed for robust visual light communication for vehicle-to-vehicle communication. An example vehicle includes a visual light communication (VLC) transmitter, a VLC communication receiver, and a VLC module. The VLC module sends a first handshake message including characteristics of the VLC transmitter and the VLC receiver using a first level of error correction. The VLC module also adjusts transmission parameters based on a received second handshake message. Additionally, the VLC module transmits data using a second level of error correction.

An example method includes sending, via a VLC transmitter, a first handshake message including characteristics of the VLC transmitter and the VLC receiver using a first level of error correction. The method also includes adjusting, by a VLC module, transmission parameters based on a received second handshake message. Additionally, the example method includes transmitting, via the VLC transmitter, data using a second level of error correction.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Vehicles that implement vehicle-to-vehicle communication can implement it using Visual Light Communication (VLC). VLC uses changes in light (e.g., on/off, light color, and/or light intensity, etc.) transmitted by a light source (such as an LED) to transmit data packets. A VLC transmitter modulates the light. A VLC receiver uses an image sensor, such as a camera with a CMOS sensor or a photodiode, and a rolling shutter to decode the modulated light signal into a serial string of binary numbers that can be further processed by a circuit. However, the cameras used to capture the VLC data have different properties, including frame-to-frame time gaps, dynamic range, and color sensitivity.

The frame-to-frame time gap can cause a considerable amount of lost data. Frames are a number of pixels that the CMOS sensor can picture before resetting and transferring frame data. For example, the CMOS sensor may have a width of 256 pixels. In such an examples, when the 256 pixels worth of data is captured (which may be used to transmit more the 256 bits of data when color and intensity modulation is used), the image is processed and the frame is reset. The frame-to-frame time gap is the time between one frame being filled and the next frame ready to capture data. For example, one camera may have a frame-to-frame time gap of 25 milliseconds (ms) and another camera may have a frame-to-frame time gap of 50 ms. During the frame-to-frame time gap, the CMOS sensor cannot capture data which means the data sent by the VLC transmitter is lost. Traditionally, to combat this loss, the transmitter transmits each frame multiple times (e.g., three times). Additionally, the frames may include an error detecting code (such as a cyclic redundancy check (CRC)) that is used to detect when data is lost and to reconstruct the lost data (sometimes referred to as error correction). This has a significant impact on data transmission rates.

As another example, CMOS sensors have varying color sensitivities and dynamic ranges which can affect transmitter being able to encode additional data into a transmission (e.g. via intensity modulation, color modulation, etc.). As a result, the VLC system may need to support multiple camera systems with vary color detection fidelity that limits the maximum color channels/intensities encoded by the transmitter.

As described below, the VLC systems of a transmitting and a receiving vehicles communicate in two phases. In a first phase, the transmitting and the receiving vehicles exchange handshake messages using a first level of error correction. In the handshake messages, the vehicles exchange properties to their respective transmitter and receiver. The first level of error correction includes redundant error detecting codes and uses different techniques (e.g., sending frames multiple times, interleaved hamming coding, constant-power 4-PAM, random linear coding, etc.) to facilitate error tolerant communication of the handshake messages. After exchanging handshake messages, the transmitting and receiving vehicles change operating parameters according to a set of shared rules based on the properties of both the sending and receiving vehicles VLC systems and the properties of the lighting environment. These rules cause the VLC system of the transmitting vehicle to be configured to tolerate properties of the receiving VLC system. For example, the rules may cause both of the VLC systems to use the frame-to-frame time gap of the VLC system with the longest frame-to-frame time gap. In a second phase, the transmitting and the receiving vehicles exchange data (e.g., safety messages, coordinates cruise control information, etc.) using a second level of error correction. The second level of error correction uses techniques that are less bandwidth intensive than the first level of error correction. For example, the first level of error correction may use a CRC code and the second level of error correction may user a parity bit. As another example, the first level of error correction may transmit three copies of the data using an interleaved Hamming coding scheme to encode the data and the second level of error correction may transmit two copies of the data without any error correction encoding.

Figure 1:
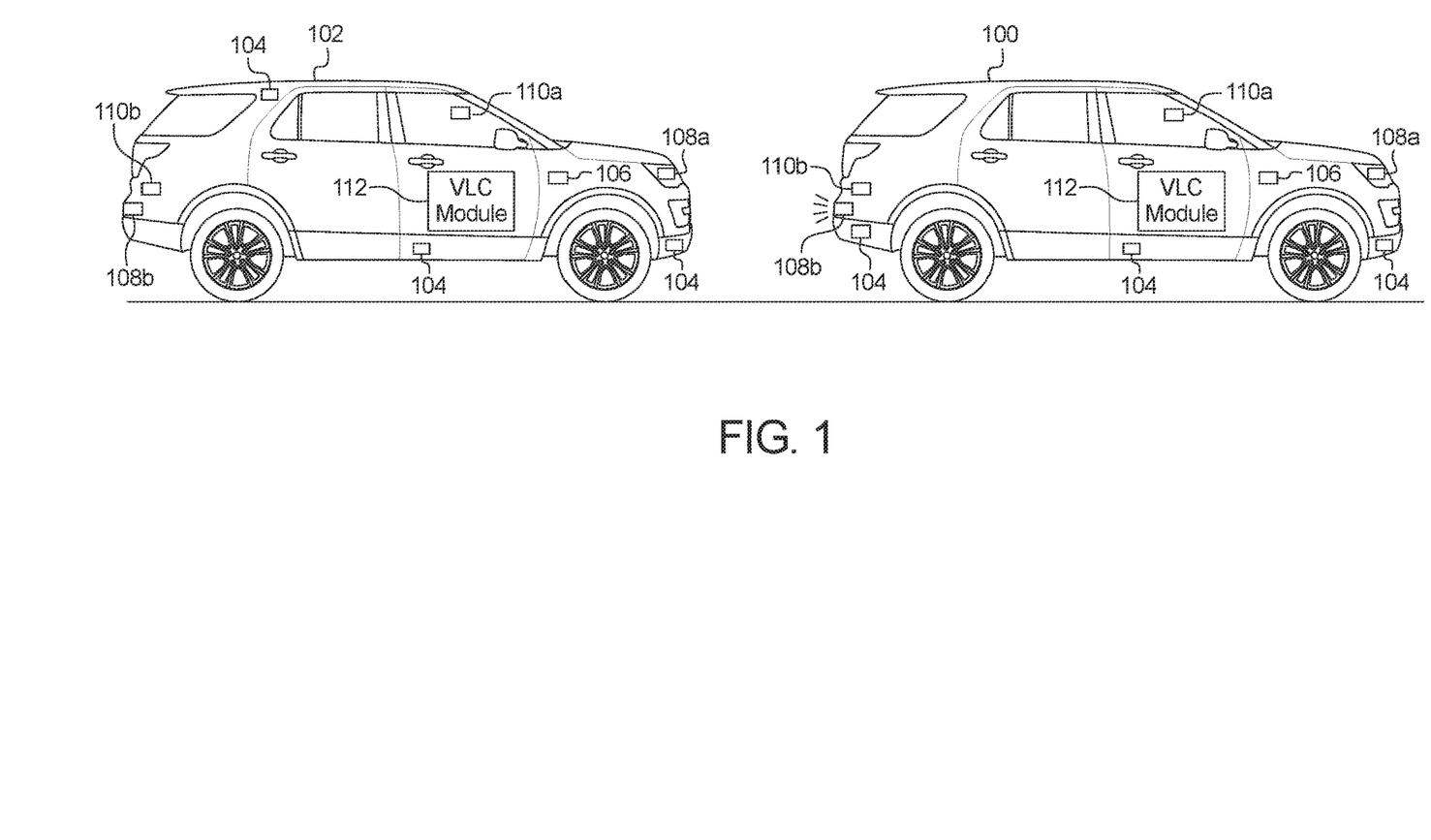
FIG. 1 illustrates a transmitting vehicle and a receiving vehicle operating in accordance with the teachings of this disclosure.

FIG. 1 illustrates a first vehicle 100 and a second vehicle 102 operating in accordance with the teachings of this disclosure. As used herein, one of the vehicles 100 and 102 is referred to as the transmitting vehicle when it is using visual light communication (VLC) to broadcast status message (e.g., safety messages, coordination messages, etc.) (e.g., the vehicle that is in front of another vehicle) and one of the vehicles 100 and 102 is referred to as the receiving vehicle when it is the vehicle capturing the broadcast messages (e.g., the vehicle that is behind the transmitting vehicle 100). Both vehicles 100 and 102 may have capability to transmit and receive and their roles may be different depending on their relationship with other vehicles. For example, in one vehicle pair, a vehicle may be a transmitting vehicle and in another vehicle pair, the same vehicle may be a receiving vehicle. In some examples, the vehicles are engaged in bi-directional communication and for some purposes be the transmitting vehicle and for some purposes be the receiving vehicle. The vehicles 100 and 102 may be standard gasoline powered vehicles, hybrid vehicles, electric vehicles, fuel cell vehicles, and/or any other mobility implement type of vehicle. The vehicles 100 and 102 include parts related to mobility, such as a powertrain with an engine, a transmission, a suspension, a driveshaft, and/or wheels, etc. The vehicles 100 and 102 may be non-autonomous, semi-autonomous (e.g., some routine motive functions controlled by the vehicles 100 and 102), or autonomous (e.g., motive functions are controlled by the vehicles 100 and 102 without direct driver input). In the illustrated example, the vehicles 100 and 102 include sensors 104, electronic control units (ECUs) 106, VLC transmitters 108a and 108b, VLC receivers 110a and 110b, and VLC modules 112.

The sensors 104 may be arranged in and around the respective vehicle 100 and 102 in any suitable fashion. The sensors 104 may mounted to measure properties around the exterior of the vehicle 100 and 102. Additionally, some sensors 104 may be mounted inside the cabin of the vehicle 100 and 102 or in the body of the vehicle 100 and 102 (such as, the engine compartment, the wheel wells, etc.) to measure properties in the interior of the vehicle 100 and 102. For example, such sensors 104 may include accelerometers, odometers, tachometers, pitch and yaw sensors, wheel speed sensors, microphones, tire pressure sensors, and biometric sensors, etc. The sensors 104 are communicatively coupled to the ECUs 106. The measurements from the sensors 104 are used to determine the state of the vehicle 100 and 102 (e.g., location, orientation, speed, etc.) and are communicated to other vehicles to facilitate collaborative driving autonomous or semi-autonomous features (e.g., blind spot detection, lane assist, adaptive cruise control, adaptive traction control, etc.) and/or traffic marshalling (e.g., collaborative adaptive cruise control, autopilot, traffic signal-less traffic management, etc.).

The ECUs 106 monitor and control the subsystems of the vehicle 100 and 102. The ECUs 106 communicate and exchange information via a vehicle data bus. Additionally, the ECUs 106 may communicate properties (such as, status of the ECU 106, sensor readings, control state, error and diagnostic codes, etc.) to and/or receive requests from other ECUs. Some vehicles 100 and 102 may have seventy or more ECUs 106 located in various locations around the vehicle 100 and 102 communicatively coupled by the vehicle data bus. The ECUs 106 are discrete sets of electronics that include their own circuit(s) (such as integrated circuits, microprocessors, memory, storage, etc.) and firmware, sensors, actuators, and/or mounting hardware. For examples, the ECUs 106 may include a powertrain control unit, a body control unit, a telematics unit, and/or a steering control unit, etc. The ECUs 106 process the measurements from the sensors 104. For example, an ECU may determine the speed of the vehicle 100 and 102 based on measurements from wheel speed sensors. In another example, an ECU may determine road conditions based on measurements from wheel speed sensors and measurements from ultrasonic sensors, etc.

The VLC transmitters 108a and 108b are light sources, such as light emitting diodes (LEDs). In some examples, the VLC transmitters 108a and 108b are incorporated into the lights of the vehicle 100 (e.g., the headlights, the brake lights, etc.). A described below, the VLC module 112 modulates the VLC transmitters 108a and 108b to serially transmit data as a time dependent series of on and off signals. In some examples, the VLC module 112 also modulates intensity and/or color of the VLC transmitter 108a and 108b. Generally, the rate at which the VLC transmitters 108a and 108b modulate the LED is imperceptible to the human eye.

The VLC receivers 110a and 110b are photo diodes or image sensors that capture the modulation of the light by the VLC transmitter 108a and 108b. Photodiodes have various performance properties that can affect VLC reception (such as rise/fall times). In some examples, the VLC receivers 110a and 110b are cameras that use a rolling shutter based CMOS image sensor. The VLC receivers 110a and 110b are configure so the light that enters the VLC receiver 110a and 110b is uniformly distributed across the face of the image sensor. In some examples, the VLC receivers 110a and 110b are incorporated into dual-mode cameras that perform the functions of image acquisition (e.g., as part of a rear-view camera) and VLC receiver. Examples dual-mode cameras are described in "Dual Mode Vehicle Camera for Visual Light Communication," application Ser. No. 16/118,735, filed on Aug. 31, 2018, which is hereby incorporated by reference in its entirety.

The VLC module 112 modulates the VLC transmitters 108a and 108b to transmit data and analyzes image captured by the VLC receivers 110a and 110b to decode received messages. In some examples, the VLC module 112 is incorporated into or communicative couple to a vehicle-to-vehicle (V2V) communication module that constructs the data payload (e.g., a safety message) to be broadcast and to parse the data payload of received messages. In such examples, the VLC module 112 (a) receives the data payload from the V2V communication module and constructs the message to be broadcast and (b) separates the data payload from messages received from other vehicles. Using the payload, the VLC module 112 constructs a message based on parameters of the VLC transmitters 108a and 108b and the VLC receivers 110a and 110b and an error correction level.

The VLC module 112 manages the transmission and reception parameters of the VLC transmitter 108a and 108b and the VLC receiver 110a and 110b respectively. These characteristics include, for example, the frame-to-frame time gap of the VLC receiver's image sensor, rolling shutter row exposure time, frame rate, the blooming percentage or factor, lens vignette percentage or factor, and/or a color percentage or factor, etc.

Figure 2:
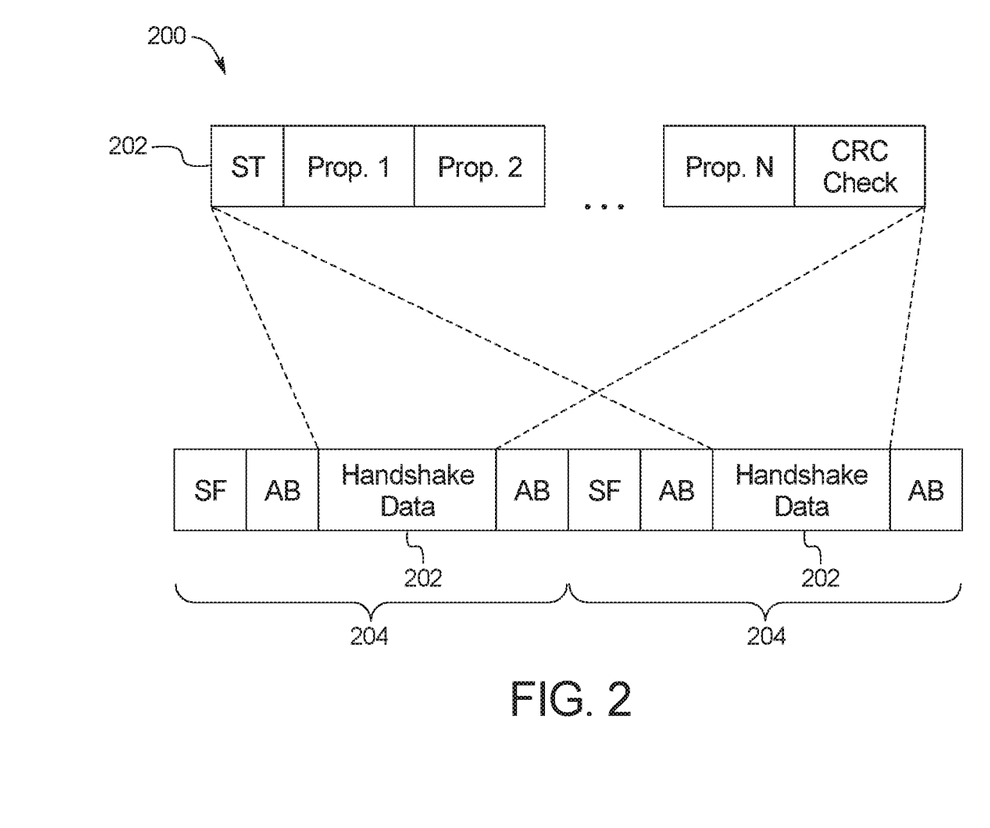
FIG. 2 depicts a handshake message communicated between the transmitting vehicle and the receiving vehicle of FIG. 1.

To initiate communication with another vehicle, the VLC module 112 transmits a handshake message. FIG. 2 illustrates an example of the handshake message 200. In FIG. 2, the handshake message 200 includes a payload 202. The payload 202 includes parameter data for the VLC transmitter 108a and 108b and the VLC receiver 110a and 110b. In the illustrated example, the payload 202 includes the frame-to-frame time gap of the VLC receiver's image sensor, the blooming percentage or factor, lens vignette percentage or factor, and a color percentage or factor. Additionally, in the illustrated example, the payload 202 includes a cyclic redundancy check (CRC) value. To construct the handshake message 200 to be transmitted, the VLC module 112 uses a first level of error correction. The first level of error correction includes redundant error detecting codes and uses different techniques (e.g., sending frames multiple times, interleaved hamming coding, constant-power 4-PAM, random linear coding, etc.) to facilitate error tolerant communication of the handshake messages. In the example illustrated in FIG. 2 the handshake message 200 includes two subpackets 204, each with a copy of the payload 202. Each subpacket 204 also includes a start frame bit and asynchronous bits. In some examples, the subpackets 204 may also include a CRC value. The handshake message 200 may be constructed in any appropriate manner such that it includes multiple redundant error tolerant techniques. In some examples, VLC module 112 transmits the handshake message 200 until an acknowledge (ACK) message is received from the other vehicle.

In response to receiving a handshake message 200 from the other vehicle, the VLC module 112 sends an ACK message and analyzes the received payload 202 to determine the parameters of the VLC transmitter 108a and 108b and VLC receiver 110a and 110b of the other vehicle. Based on the parameters of the VLC transmitters 108a and 108b and VLC receivers 110a and 110b of both vehicles, modify its transmission characteristics. The VLC module stores a set of rules that cause it to configure its transmission and reception parameters to tolerate the least capable of each of the VLC systems of the vehicles. For example, the VLC module 112 may adjust a time gap between transmitting frames of data to match the frame-to-frame time gap of the VLC receiver 110a and 110b of the other vehicle. As another example, the VLC module 112 may adjust the brightness of the LED of the VLC transmitter 108a and 108b to account for the bloom of the VLC receiver 110a and 110b of the other vehicle. As another example, the VLC module 112 may activate, deactivate, or modify the VLC transmitter 108a and 108b encoding scheme transmitted to the VLC receiver 110a and 110b of the other vehicle.

After adjusting the transmission and/or reception characteristics, the VLC module 112 transmits messages using a second level of error correction. The second level of error correction uses fewer redundancy techniques than the first level of error correction such that the overhead (e.g., number of bits) caused by the second level of error correction is less than the overhead caused by the first level of error correction. For example, the first level of error correction may use a CRC value and the second level of error correction may use a parity bit. As another example, the first level of error correction may transmit three copies of the data using an interleaved Hamming coding scheme to encode the data and the second level of error correction may transmit two copies of the data without any error correction encoding.

Figure 3:
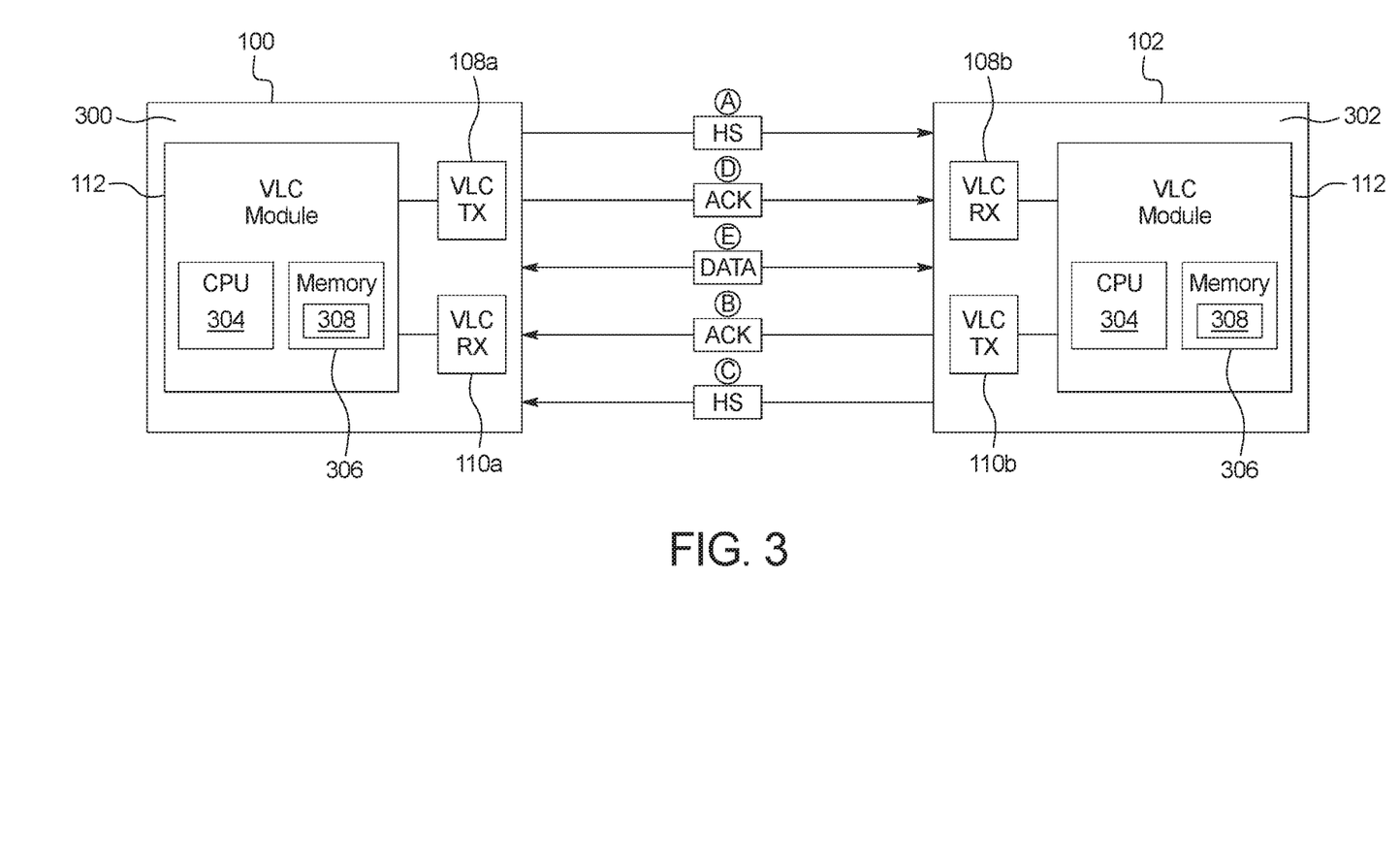
FIG. 3 is a block diagram of electronic components of the transmitting vehicle and electronic components of the receiving vehicle.

FIG. 3 is a block diagram of electronic components 300 of the transmitting vehicle 100 and electronic components 302 of the receiving vehicle 102. The electronic components 300 and 302 include the VLC receivers 110a and 110b, the VLC transmitters 108a and 108b, and the VLC modules 112.

The VLC modules a processor or controller 304 and memory 306. The processor or controller 304 may be any suitable processing device or set of processing devices such as, but not limited to: a microprocessor, a microcontroller-based platform, a suitable integrated circuit, one or more field programmable gate arrays (FPGAs), and/or one or more application-specific integrated circuits (ASICs). The memory 306 may be volatile memory (e.g., RAM, which can include non-volatile RAM, magnetic RAM, ferroelectric RAM, and any other suitable forms); non-volatile memory (e.g., disk memory, FLASH memory, EPROMs, EEPROMs, non-volatile solid-state memory, etc.), unalterable memory (e.g., EPROMs), read-only memory, and/or high-capacity storage devices (e.g., hard drives, solid state drives, etc.). In some examples, the memory 306 includes multiple kinds of memory, particularly volatile memory and non-volatile memory. In the illustrated example, the characteristics 308 of the VLC transmitters 108a and 108b and the VLC receivers 110a and 110b are stored in the memory 306.

The memory 306 is computer readable media on which one or more sets of instructions, such as the software for operating the methods of the present disclosure can be embedded. The instructions may embody one or more of the methods or logic as described herein. In a particular embodiment, the instructions may reside completely, or at least partially, within any one or more of the memory 306, the computer readable medium, and/or within the processor 304 during execution of the instructions.

The terms "non-transitory computer-readable medium" and "tangible computer-readable medium" should be understood to include a single medium or multiple media, such as a centralized or distributed database, and/or associated caches and servers that store one or more sets of instructions. The terms "non-transitory computer-readable medium" and "tangible computer-readable medium" also include any tangible medium that is capable of storing, encoding or carrying a set of instructions for execution by a processor or that cause a system to perform any one or more of the methods or operations disclosed herein. As used herein, the term "tangible computer readable medium" is expressly defined to include any type of computer readable storage device and/or storage disk and to exclude propagating signals.

In operation, the transmitting vehicle 100 broadcasts a handshake message 200 which includes at least a portion of the characteristics 308 stored in memory 306 (A). The receiving vehicle 102 receives the handshake message 200 and transmits an ACK message (B). The receiving vehicle 102 broadcasts a handshake message 200 which includes at least a portion of the characteristics 308 stored in memory 306 (C). The transmitting vehicle 100 receives the handshake message 200 and transmits an ACK message (D). The transmitting vehicle 100 and receiving vehicle 102 adjust the transmission and reception parameters of their respective VLC modules 112. The transmitting vehicle 100 then begins to transmit data (e.g., safety messages, etc.) to the receiving vehicle (E).

Figure 4:
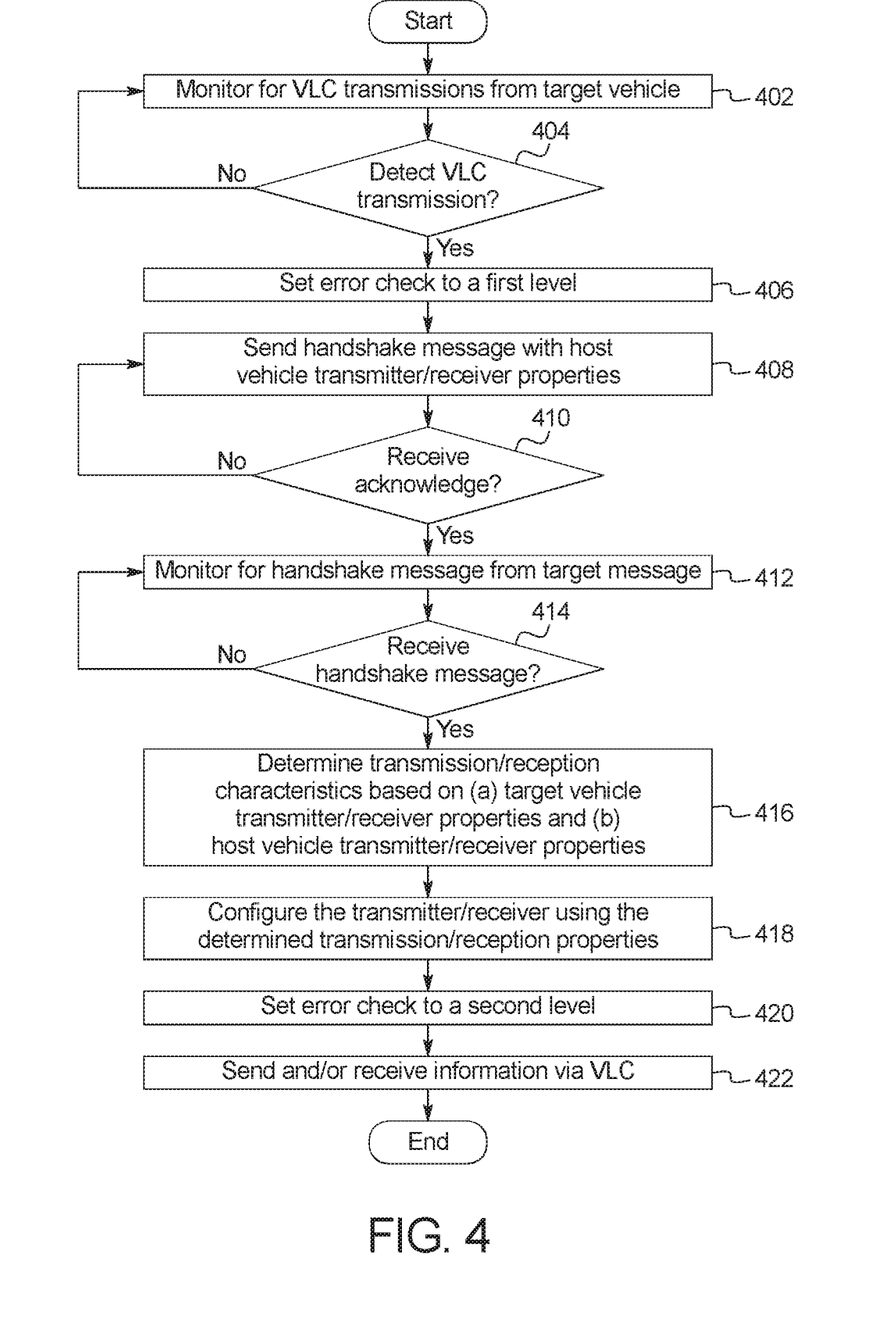
FIG. 4 is a flowchart of a method to establish robust communication for visual light communication, which may be implemented by the electronic components of FIG. 3.

FIG. 4 is a flowchart of a method to establish robust communication for visual light communication, which may be implemented by the electronic components 300 and 302 of FIG. 3. Initially, at block 402, the VLC module 112, via the VLC receivers 110a and 110b, monitor for VLC communication from a proximate vehicle. At block 404, the VLC module 112 determines whether a VLC transmission has been detected. When a VLC transmission has been detected, the method continues at block 406. Otherwise, when a VLC transmission has not been detected, the method returns to block 402. At block 406, the VLC module 112 sets an error correction to a first level. At block 408, the VLC module 112 sends a handshake message 200 using the first level of error correction. At block 410, the VLC module determines whether an ACK message has been received. When an ACK message has been received, the method continues at block 412. Otherwise, when an ACK message has not been received, the method returns to block 408.

At block 412, the VLC module 112 monitors for a handshake message 200. At block 414, when a handshake message has been received, the method continues at block 416. Otherwise, when a handshake message has not been received, the method returns to block 412. At block 416, the VLC module 112 determines transmission and reception parameters based on (a) the transmission and reception characteristics in the received handshake message and (b) its own transmission and reception characteristics. At block 418, the VLC module 112 configures the VLC transmitter 108a and 108b and/or the VLC receivers 110a and 110b based on the determined transmission and reception parameters. At block 420, the VLC module 112 sets an error correction to a second level that has less overhead than the first level. At block 422, the VLC module 112 sends and/or receives data.

The flowchart of FIG. 4 is representative of machine readable instructions stored in memory (such as the memory 306 of FIG. 3) that comprise one or more programs that, when executed by a processor (such as the processor 304 of FIG. 3), cause the vehicle 100 to implement the example VLC module 112 of FIGS. 1 and 3. Further, although the example program(s) is/are described with reference to the flowchart illustrated in FIG. 4, many other methods of implementing the example VLC module 112 may alternatively be used. For example, the order of execution of the blocks may be changed, and/or some of the blocks described may be changed, eliminated, or combined.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". As used here, the terms "module" and "unit" refer to hardware with circuitry to provide communication, control and/or monitoring capabilities, often in conjunction with sensors. "Modules" and "units" may also include firmware that executes on the circuitry. The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
   a visual light communication (VLC) transmitter;
   a VLC receiver; and
   a VLC module to:
   send a first handshake message including characteristics of the VLC transmitter and the VLC receiver using a first level of error correction;
   adjust transmission parameters based on a received second handshake message;
   transmit data using a second level of error correction.

2. The vehicle of claim 1, wherein the second level of error correction has less overhead than the first level of error correction.

3. The vehicle of claim 1, wherein the VLC module includes memory to store the characteristics of the VLC transmitter and the VLC receiver.

4. The vehicle of claim 1, wherein the characteristics include a frame-to-frame gap of the VLC receiver.

5. The vehicle of claim 1, wherein adjusting the transmission parameters includes adjusting a frame-to-frame time gap of the VLC transmitter to match a frame-to-frame time gap characteristic included in the second handshake message.

6. The vehicle of claim 1, wherein the characteristics include a frame-to-frame time gap, a blooming factor, a lens vignette factor, and a color factor.

7. The vehicle of claim 1, wherein the first level of error correction causes the VLC transmitter to transmit data frames multiple consecutive times.

8. The vehicle of claim 7, wherein the second level of error correction causes the VLC transmitter to transmit the data frames fewer times than the first level of error correction.

9. A method comprising:
   sending, via a visual light communication (VLC) transmitter, a first handshake message including characteristics of the VLC transmitter and a VLC receiver using a first level of error correction;
   adjusting, by a VLC module with a processor, transmission parameters based on a received second handshake message;
   transmitting, via the VLC transmitter, data using a second level of error correction.

10. The method of claim 9, wherein the second level of error correction has less overhead than the first level of error correction.

11. The method of claim 9, wherein the VLC module includes memory to store the characteristics of the VLC transmitter and the VLC receiver.

12. The method of claim 9, wherein the characteristics include a frame-to-frame gap of the VLC receiver.

13. The method of claim 9, wherein adjusting the transmission parameters includes adjusting a frame-to-frame time gap of the VLC transmitter to match a frame-to-frame time gap characteristic included in the second handshake message.

14. The method of claim 9, wherein the characteristics include a frame-to-frame time gap, a blooming factor, a lens vignette factor, and a color factor.

15. The method of claim 9, wherein the first level of error correction causes the VLC transmitter to transmit data frames multiple consecutive times.

16. The method of claim 15, wherein the second level of error correction causes the VLC transmitter to transmit the data frames fewer times than the first level of error correction.

\* \* \* \* \*